United States Patent
Wallrafen et al.

(10) Patent No.: US 10,555,451 B2
(45) Date of Patent: Feb. 4, 2020

(54) METHOD FOR MOUNTING SMD COMPONENTS ON CONTACT SPRINGS IN ELECTRIC MOTORS

(71) Applicant: CONTINENTAL AUTOMOTIVE GmbH, Hannover (DE)

(72) Inventors: Werner Wallrafen, Hattersheim (DE); Daniel Muresan, Giroc (RO)

(73) Assignee: Continental Automotive GmbH, Hannover (DE)

( * ) Notice: Subject to any disclaimer, the term of this patent is extended or adjusted under 35 U.S.C. 154(b) by 284 days.

(21) Appl. No.: 15/509,444

(22) PCT Filed: Sep. 7, 2015

(86) PCT No.: PCT/EP2015/070323
§ 371 (c)(1),
(2) Date: Mar. 7, 2017

(87) PCT Pub. No.: WO2016/037955
PCT Pub. Date: Mar. 17, 2016

(65) Prior Publication Data
US 2017/0280599 A1    Sep. 28, 2017

(30) Foreign Application Priority Data

Sep. 8, 2014 (DE) .................. 10 2014 217 924

(51) Int. Cl.
*H05K 3/30* (2006.01)
*H05K 13/04* (2006.01)
*H02K 5/22* (2006.01)

(52) U.S. Cl.
CPC .............. *H05K 13/046* (2013.01); *H02K 5/22* (2013.01)

(58) Field of Classification Search
CPC ................................ H02K 5/22; H05K 13/046
See application file for complete search history.

(56) References Cited

U.S. PATENT DOCUMENTS 4,982,376 A * 1/1991 Megens ............... H05K 3/3415
174/263
6,045,653 A    4/2000 Johnson
(Continued)

FOREIGN PATENT DOCUMENTS

DE         199 48 295       6/2001
DE     10 2004 037 786      3/2006
(Continued)

*Primary Examiner* — Paul D Kim
(74) *Attorney, Agent, or Firm* — Cozen O'Connor

(57) ABSTRACT

A method for mounting SMD components on contact springs in electric motors. In a first method variation, the SMD component is mounted on the base of a carrier of the electric motor, which has already been provided with a contact spring protruding into a cavity. As the SMD component is installed, the contact spring is pressed back such that no frictional or sliding contact arises during installation. In a second variation, the SMD component is mounted first and then a contact spring is inserted using a press tool. As the contact spring is inserted, the spring is held back such that likewise no frictional or sliding contact arises with the SMD component that has already been installed. This avoids damage to the SMD component caused by the contact spring during installation.

14 Claims, 1 Drawing Sheet

(56) References Cited

U.S. PATENT DOCUMENTS

2005/0239331 A1   10/2005  Bourdykina et al.
2018/0041026 A1*   2/2018  Sakamoto ................ H01G 2/06

FOREIGN PATENT DOCUMENTS

| | | |
|---|---|---|
| DE | 10 2012 218 847 | 4/2014 |
| EP | 1624550 | 2/2006 |
| JP | S5979389 A | 5/1984 |
| JP | S 60-192680 | 10/1985 |
| JP | H04121384 A | 4/1992 |
| JP | H11154800 A | 6/1999 |
| JP | 2000049437 A * | 2/2000 |
| JP | 2001008414 | 1/2001 |
| JP | 2014510406 | 4/2014 |
| WO | WO 0139354 A1 | 5/2001 |
| WO | WO 2012/120032 | 9/2012 |
| WO | WO 2014/115244 | 7/2014 |

* cited by examiner

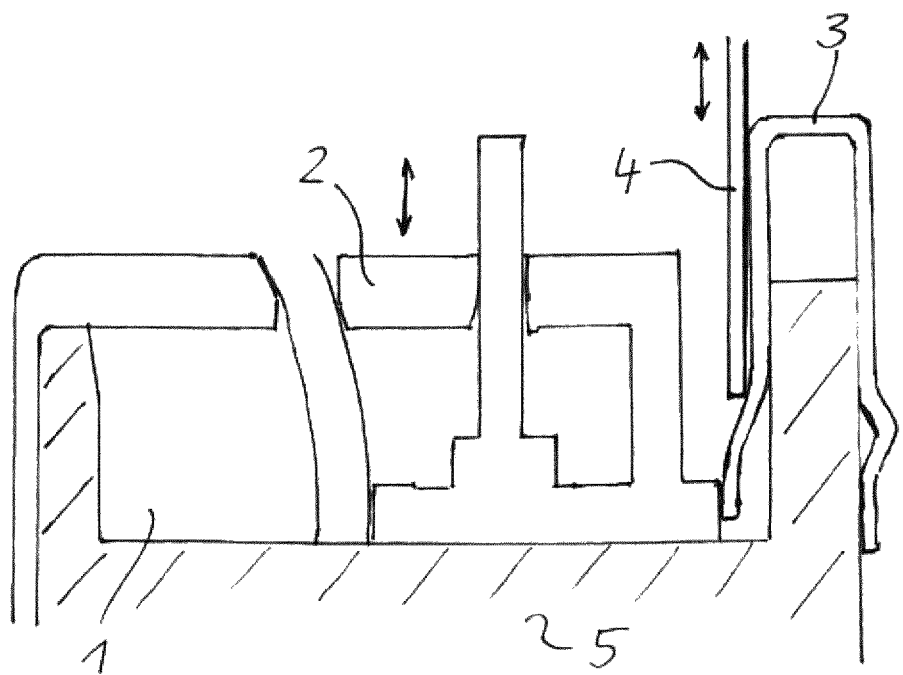
FIG. 1
FIG. 2
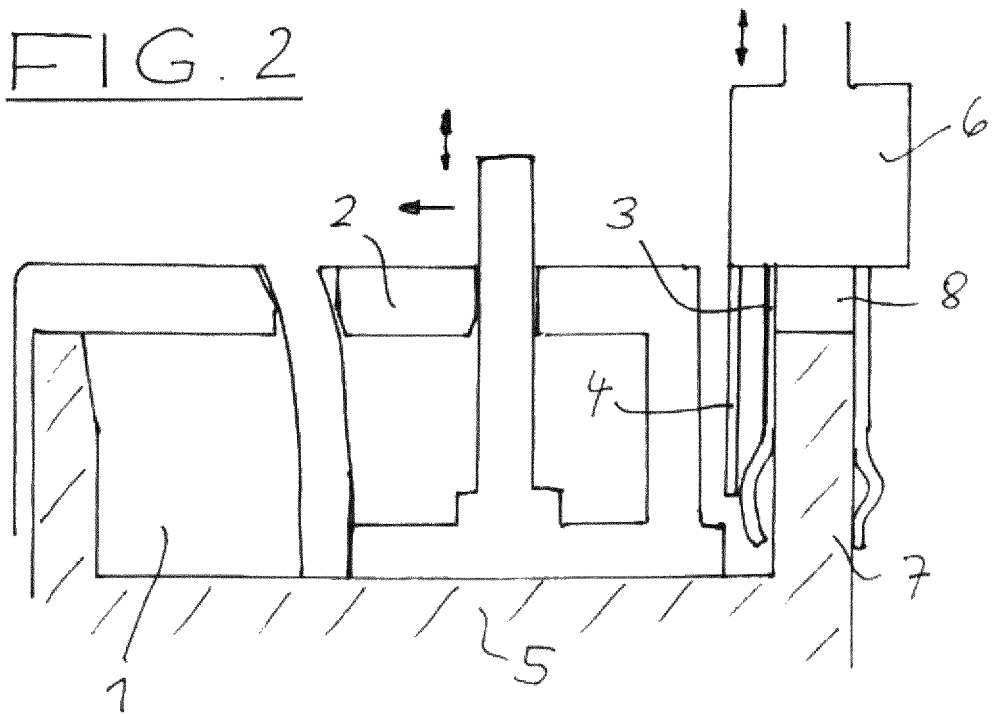

METHOD FOR MOUNTING SMD COMPONENTS ON CONTACT SPRINGS IN ELECTRIC MOTORS

CROSS REFERENCE TO RELATED APPLICATIONS

This is a U.S. national stage of application No. PCT/EP2015/070323, filed on Sep. 7, 2015. Priority is claimed on German Application No. DE102014217924.6 filed Sep. 8, 2014, the content of which is incorporated here by reference.

BACKGROUND OF THE INVENTION

1. Field of the Invention

The present invention relates to a method for mounting SMD components on contact springs in electromotors.

2. Description of Prior Art

Compared with wired electronic components, SMD components (SMD: surface mounted device) are characterized by their compact structure and ease of fitting. They are normally attached to PCBs or ceramic substrates and welded to conductor paths or PCBs. For their part, the conductor paths then have to be connected to further electrical connections, in particular via connecting cables or wires.

SUMMARY OF THE INVENTION

The present case concerns the mounting of such SMD components on contact springs in electromotors. Such SMD components are hereby preferably arranged in cavities provided in corresponding supports for the SMD components and project into the contact springs of lateral contacts of the electromotors. Because the SMD components are very sensitive parts that are made, for example, from ceramic, there is a high risk that damage can be caused to the SMD components by the contact with the contact springs due to friction or adhesion effects during the mounting of these components.

One aspect of the present invention provides a method that enables the SMD components to be bandied particularly gently during their mounting.

According to one aspect of the invention a method has the following steps:
 a. gripping an SMD component to be mounted on the base of a support of the electromotor using a gripping and mounting tool;
 b. moving the SMD component over the mounting point on the support;
 c. pushing back a contact spring projecting into the cavity using a pusher;
 d. arranging the SMD component on the base of the support;
 e. removing the gripping and mounting tool; and
 f. removing the pusher.

The first embodiment of the method according to the invention relates to a variant of the method in which an SMD component is arranged on the base of a support of the electromotor that is already provided with a mounted contact spring. This contact spring has therefore already been arranged before the mounting of the SMD component. During the mounting of the SMD components were it not for the measures according to the invention it would therefore contact (laterally touch) the contact spring so that the above described damage could occur.

According to one aspect of the invention, the projecting contact spring is then pushed back using a pusher so that the SMD component can be mounted completely on the base of the support without contact or with reduced force or reduced contact pressure. The SMD component is preferably mounted without any mechanical contact with the contact spring of the lateral contact. After the SMD component has been mounted, the gripping and mounting tool for the SMD component and the pusher are removed. When the pusher is removed, the contact spring is moved into its untensioned state in which it contacts the SMD component with lateral pressure and establishes the corresponding electrical contact.

In a second alternative of the method according to one aspect of the invention, the contact spring is mounted only after the SMD component has been arranged on the base of the support. This alternative is therefore characterized by the following method steps:
 a. gripping an SMD component to be mounted on the base of a support of the electromotor using a gripping and mounting tool;
 b. arranging the SMD component on the base of the support;
 e. pressing a device holding a contact spring onto a component of the electromotor using a pressing tool and simultaneously holding back the contact spring using a pusher;
 d. removing the pressing tool and the pusher; and
 f. removing the gripping and mounting tool.

In this variant of the method, the contact spring is mounted after the SMD component has been mounted. This is accomplished using a pressing tool that presses a device holding the contact spring onto a component, for example a brush holder, of the electromotor. In this pressing process, the contact spring is held back being a pusher so that during the mounting of the spring there is no mechanical contact at all with the already mounted SMD component, or only contact with little force. Optimally there is no lateral contact at all.

After the contact spring has been mounted, the pressing tool and the pusher are removed so that the contact spring can be moved into its untensioned state in pressure contact with the SMD component. The gripping and mounting tool is then removed.

It can of course also be removed before removing the pressing tool and the pusher.

In both alternatives of the method according to the invention, during the installation of the SMD component there is therefore no sliding contact at all between the component and the contact spring, or only contact with reduced contact pressure, so that there is a reduced risk of damage to the SMD component.

The SMD component is preferably arranged in a cavity of the support into which the contact spring projects. In both the first alternative and the second alternative of the method according to aspects of the invention, no contact takes place with the contact spring, or only contact with reduced contact pressure.

In the second alternative of the method according to the invention, a pressing tool is preferably used on which a pusher is arranged. In this alternative, the pressing tool and the pusher therefore form a unit so that a single component and not two separate devices needs to be handled. When the device having the contact spring is pressed onto the associated component of the electromotor, the contact spring is therefore simultaneously pushed back and held back by the pusher so that the mentioned laterally contact-free installation is possible.

Furthermore, during the mounting of the SMD component, it is preferably moved until it touches fixed lead frame contacts. Such a lead frame is, for example, a stamped grill-like part fixed on a support. The lead frame serves to establish electrical connections to further functional elements of the corresponding module, where these can be, for example, further electronic components or electromechanical parts of the module. In each case, the SMD component is hereby moved in particular into the cavity until it touches the corresponding lead frame contacts.

In the method according to one aspect of the invention; a pusher pin is preferably used as the pusher. This is a thin tool which does not obstruct the installation of the SMD component.

The method according to the invention can be performed repeatedly for multiple SMD components or for all SMD components on an electromotor. In a preferred embodiment, it is performed simultaneously with multiple SMD components to be mounted. A single process with the above described individual method steps hereby takes place.

BRIEF DESCRIPTION OF THE DRAWINGS

The invention is explained in detail below with the aid of an exemplary embodiment in conjunction with the drawings, in which:

FIG. 1 is a schematic view of the mounting of an SMD component according to a first embodiment of the invention; and FIG. 2 is a schematic view of the mounting of an SMD component according to a second embodiment of the present invention.

DETAILED DESCRIPTION OF THE PRESENTLY PREFERRED EMBODIMENTS

FIG. 1 shows schematically a plastic brush holder of an electromotor that has a cavity 1 open at the top into which it is intended for an SMD component 2 to be mounted, and a support 5. A contact spring 3, already mounted on the support 5 and via which it is intended for electrical pressure contact to be established with the SMD component 2 to be installed, projects into the cavity 1. The SMD component 2 is gripped by a gripping and mounting tool and arranged above the cavity 1. The already previously installed contact spring 3 is pushed back by a pin designed as a pusher 4 so far that no friction or sliding contact with the contact spring 3 occurs when the SMD component 2 is inserted into the cavity 1. In FIG. 1, the pusher 4 is shown in a position shortly before the contact spring 3 is pushed back.

After the SMD component 2 has reached its final position, the gripping and mounting tool (not shown) and the pusher 4 are removed again. The contact spring 3 therefore moves into the untensioned position shown in FIG. 1 in which it contacts with pressure the installed SMD component 2.

In the variant of the method shown schematically in FIG. 2, the SMD component 2 is first arranged in the cavity 1 of the support 5, after which the contact spring 3 is mounted. The SMD component 2 is hereby likewise moved into the cavity 1 using a gripping and mounting tool and is then moved horizontally to the left. In the drawing until the SMD component 2 touches the fixed lead frame contacts (not shown). A device 8 (shown only schematically) holding the contact spring 3 is then pressed onto the portion 7 of the brush holder of the motor using a pressing tool 6. In this process, the contact spring 3 is simultaneously pushed back and held back by a pusher 4, arranged on the pressing tool 6, in the form of a pin so that no friction or sliding contact with the already previously installed SMD component 2 occurs when the spring is installed. When the pressing tool 6 is removed, the pusher 4 is simultaneously moved upward with it so that the contact spring 3 can assume its untensioned end position in which it makes pressure contact with the installed SMD component 2.

In both variants of the method, gentle treatment of the SMD component 2 therefore takes place during the installation.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A method for mounting surface mount device (SMD) components on at least one projecting electrical contact spring comprising:
    gripping an SMD component to be mounted on a base of a support using a gripping and mounting tool;
    moving the SMD component over a mounting point on the support;
    pushing back the previously installed at least one projecting electrical contact spring using a pusher;
    arranging the SMD component on the base of the support after the previously installed at least one projecting electrical contact spring has been installed;
    removing the gripping and mounting tool; and
    removing the pusher so that the previously installed at least one projecting electrical contact spring directly contacts the SMD component.

2. The method as claimed in claim 1, wherein the SMD component is arranged in a cavity of the support into which the at least one contact spring projects.

3. The method as claimed in claim 2, wherein a pressing tool is used on which the pusher is arranged.

4. The method as claimed in claim 1, wherein the SMD component is moved onto its mounting point until it touches fixed lead frame contacts.

5. The method as claimed in claim 1, wherein a pusher pin is used as a pusher.

6. A method for mounting surface mount device (SMD) components on at least one projecting contact spring, comprising:
    gripping an SMD component to be mounted on a base of a support using a gripping and mounting tool;
    moving the SMD component over a mounting point on the support;

pushing back the at least one projecting contact spring using a pusher;

arranging the SMD component on the base of the support;

removing the gripping and mounting tool; and removing the pusher, wherein the method is performed simultaneously with multiple SMD components to be mounted.

7. The method for mounting SMD components on at least one contact spring as claimed in claim 1, wherein the at least one contact spring is in an electromotor.

8. A method for mounting surface mount device (SMD) components on at least one electrical contact spring of a component comprising:

gripping an SMD component to be mounted on a base of a support of the component using a gripping and mounting tool;

arranging the SMD component on the base of the support;

pressing a device holding the at least one electrical contact spring onto a component of the device using a pressing tool and simultaneously holding back the at least one electrical contact spring using a pusher;

removing the pressing tool and the pusher; and removing the gripping and mounting tool so that the at least one electrical contact spring directly electrically contacts the SMD component.

9. The method for mounting SMD components as claimed in claim 8, wherein the component is an electromotor.

10. The method as claimed in claim 8, wherein the SMD component is arranged in a cavity of the support into which the at least one contact spring projects.

11. The method as claimed in claim 10, wherein a pressing tool is used on which the pusher is arranged.

12. The method as claimed in claim 8, wherein the SMD component is moved onto its mounting point until it touches fixed lead frame contacts.

13. The method as claimed in claim 8, wherein a pusher pin is used as a pusher.

14. The method as claimed in claim 8, wherein the method is performed simultaneously with multiple SMD components to be mounted.

* * * * *